United States Patent
Morrison

(10) Patent No.: US 11,108,394 B2
(45) Date of Patent: *Aug. 31, 2021

(54) SYSTEM AND METHOD FOR INTEGRATING COMPONENTS OF AN ELECTRO-PERMANENT MAGNET KEY SWITCH ASSEMBLY

(71) Applicant: Dell Products, LP, Round Rock, TX (US)

(72) Inventor: Jason S. Morrison, Chadron, NE (US)

(73) Assignee: Dell Products, LP, Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/405,965

(22) Filed: May 7, 2019

(65) Prior Publication Data

US 2020/0358440 A1    Nov. 12, 2020

(51) Int. Cl.

| | |
|---|---|
| *H03K 17/972* | (2006.01) |
| *H01F 7/02* | (2006.01) |
| *H01H 36/00* | (2006.01) |
| *H01H 3/12* | (2006.01) |
| *H01H 13/84* | (2006.01) |
| *H01F 1/147* | (2006.01) |
| *H01F 1/057* | (2006.01) |
| *H01H 11/06* | (2006.01) |
| *H01F 7/06* | (2006.01) |

(52) U.S. Cl.
CPC .......... *H03K 17/972* (2013.01); *H01F 1/057* (2013.01); *H01F 1/147* (2013.01); *H01F 7/0273* (2013.01); *H01F 7/064* (2013.01); *H01H 11/06* (2013.01); *H01H 36/004* (2013.01)

(58) Field of Classification Search
None
See application file for complete search history.

(56) References Cited

U.S. PATENT DOCUMENTS

| | | | |
|---|---|---|---|
| 9,947,491 B1* | 4/2018 | Thome | H01H 13/14 |
| 10,491,214 B2* | 11/2019 | Casparian | G06F 3/0238 |
| 10,574,233 B2* | 2/2020 | Casparian | H03K 17/972 |
| 2013/0233685 A1* | 9/2013 | Zhang | H01H 13/85 200/344 |
| 2014/0118264 A1* | 5/2014 | Leong | G06F 3/0202 345/168 |

(Continued)

*Primary Examiner* — Curtis A Kuntz
*Assistant Examiner* — Jerold B Murphy
(74) *Attorney, Agent, or Firm* — Prol Intellectual Property Law, PLLC; H. Kenneth Prol

(57) ABSTRACT

A method for assembling an electro-permanent magnet (EPM) key assembly of an information handling system may comprise disposing a pair of scissor plate mounts framed onto a base contact assembly upward through a cap support plate opening within a cap support plate comprising a printed circuit board with pressure sensors to record keystrokes for mounting the EPM key assembly, operably connecting the base contact assembly to the cap support plate, disposing a ferromagnetic flange operably coupled to rotate with at least one scissor plate about a hinge downward through the cap support plate opening, operably connecting the pair of scissor plates to the base contact assembly such that each of the pair of scissor plates may rotate away from one another in the presence of downward force on a key cap, and situating the key cap atop the pair of scissor plates.

20 Claims, 7 Drawing Sheets

(56) References Cited

U.S. PATENT DOCUMENTS

| | | | |
|---|---|---|---|
| 2015/0243456 A1* | 8/2015 | Hsu | H01H 13/20 |
| | | | 200/344 |
| 2019/0155401 A1* | 5/2019 | Chen | G06F 1/1662 |
| 2020/0005977 A1* | 1/2020 | Keltz | H01F 7/064 |

* cited by examiner

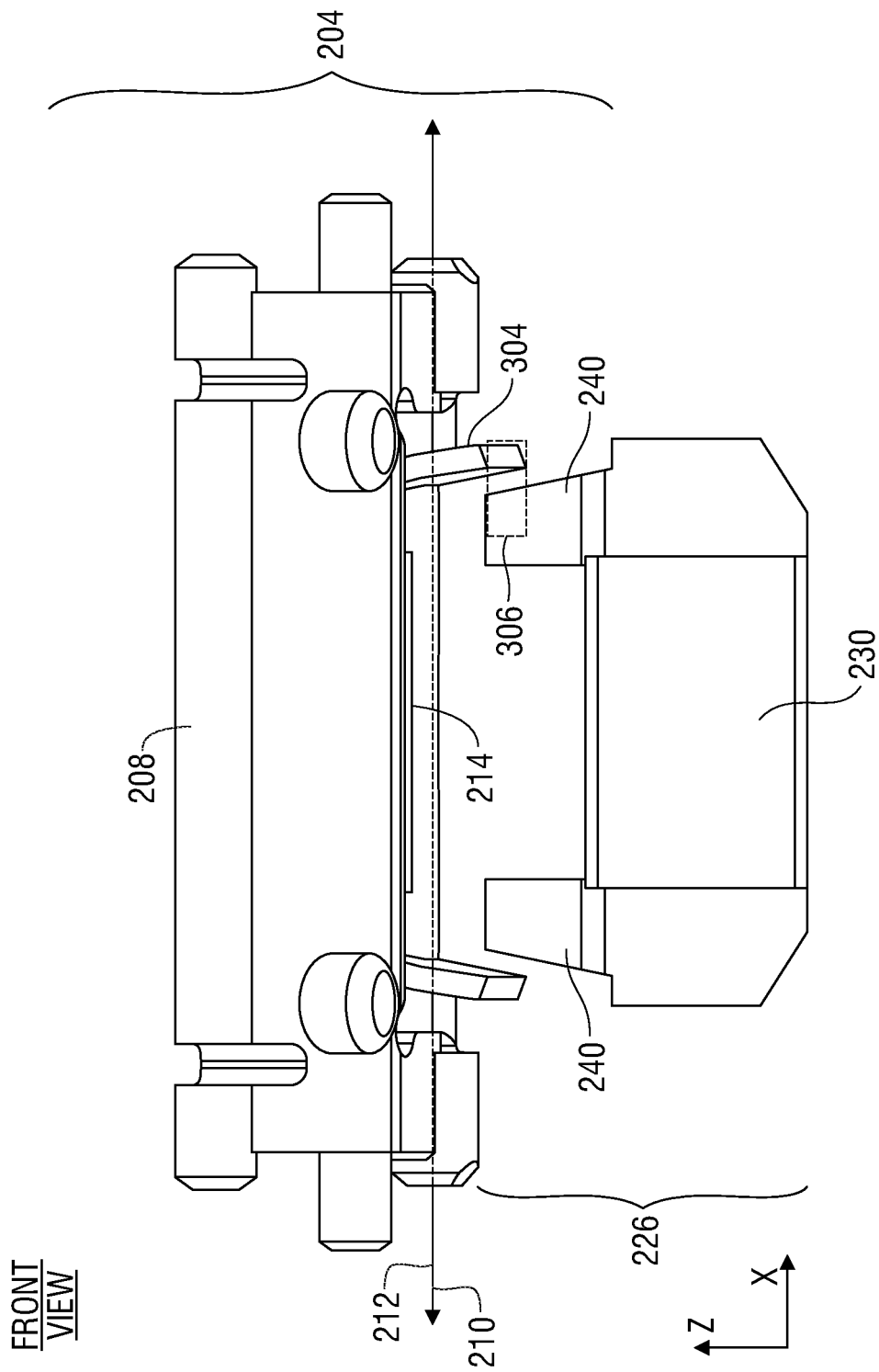

SYSTEM AND METHOD FOR INTEGRATING COMPONENTS OF AN ELECTRO-PERMANENT MAGNET KEY SWITCH ASSEMBLY

FIELD OF THE DISCLOSURE

The present disclosure generally relates to a keyboard key switch assembly of information handling systems. The present disclosure more specifically relates to the use of electropermanent magnets in key switch assemblies.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 3B is a front graphical diagram view of an electropermanent magnet (EPM) and a scissor plate assembly in a depressed position according to an embodiment of the present disclosure;

The use of the same reference symbols in different drawings may indicate similar or identical items.

DETAILED DESCRIPTION OF THE DRAWINGS

Figure 1:
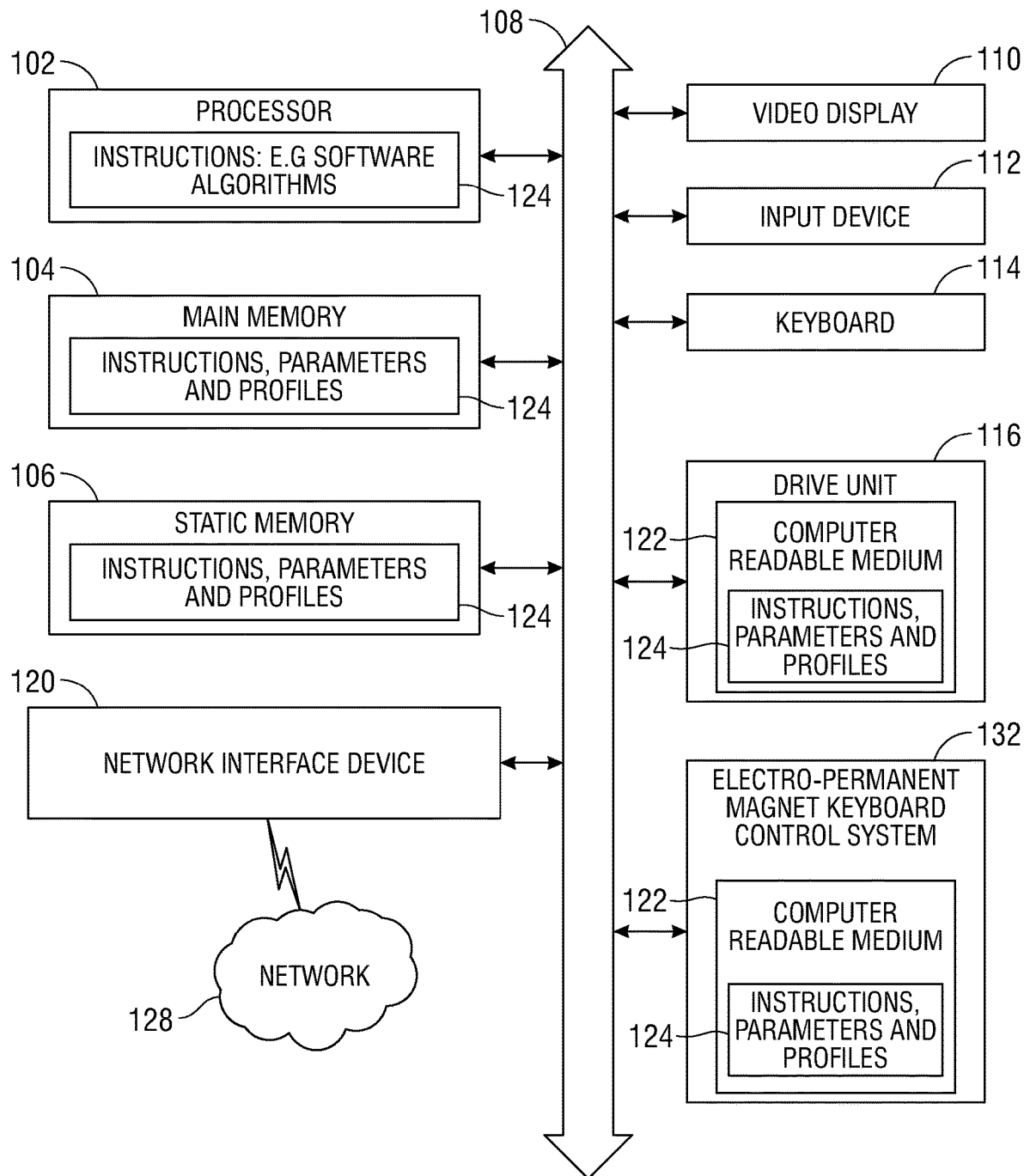
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for a key assembly that may include a key cap situated atop two scissor plates that may rotate outward from one another as a user applies downward force to the key cap (e.g., pressing the key). In embodiments of the present disclosure, the outward rotation of the scissor plates caused by the user applying downward force on the key cap may simultaneously cause a flange susceptible to magnetic forces to rotate away from a magnet situated beneath the scissor plates. Once the user removes the downward force in such an embodiment, the magnet may exert a magnetic force to pull the flange operably connected to the scissor plates back toward the magnet. This may cause the scissor plates to rotate toward one another, pushing the key cap back to its neutral position, flush with the surface of the keyboard.

In addition to providing sufficient upward force to return the key back to its neutral position, use of such a magnetic key assembly in an embodiment may supply a consistent upward force the user must overcome in order to depress the key cap far enough for the information handling system to register its depression as a keystroke. This resistive key force may feel to the user as if the key cap is travelling a deeper distance into the keyboard than it actually is.

Permanent magnets may be employed in magnetic keyboard assemblies in order to generate the upward force necessary to return the key cap to a neutral position and provide the user with the desired tactile sensation while depressing the key cap. However, magnetic fields generated by such permanent magnets cannot be adjusted, but rather, provide the same attractive force consistently. As such, the use of permanent magnets may not allow for a plurality of neutral positions, such as a retraction option.

Embodiments of the present disclosure employ electropermanent magnets (EPMs) in the key assembly in order to provide an adjustable upward force to return each key cap to its neutral position, and to allow each key to be placed in a plurality of neutral positions such as a raised neutral or a retracted, depressed position. Further, each keyboard key in embodiments of the present disclosure may include a separate electropermanent magnet, which may be controlled on an individual basis by an electropermanent magnet keyboard control system. Such embodiments allow the user to set an entire keyboard or even a single key within the keyboard to be retracted and deactivated via turning the EPM for that key or keys to an off state. In other embodiments, an entire keyboard or specific keys may also be set to a specific resistive force chosen by the user to provide the optimal tactile sensation for that user if a multi-level EPM is used in the key assembly. The low intensity magnetic field generated by such an electropermanent magnet in embodiments of the present disclosure may thus allow for more granular control of each key.

In order to ensure such a low intensity magnetic field is also sufficient to return the key cap to its neutral position, embodiments of the present disclosure add flanges to the magnetic element operably connected to the scissor plates that must be drawn toward the magnet to place the key cap back in its neutral position. These flanges may wrap around the external sides of the electropermanent magnet in embodiments, in order to increase the cross-sectional surface area in which the magnetic element operably connected to the scissor plates overlaps the electropermanent magnet. As the overlapping surface area increases, so to does the force with which the electropermanent magnet draws the magnetic element operably connected to the scissor plates toward it. Using such an electropermanent magnet key assembly may provide an upward force to return each key cap to its neutral position when the EPM is in an on state.

The proximity between the interior surfaces of the flange protrusions and the exterior sides of the magnetically soft shunts is critical to the ability of the magnetic field generated by the electro-permanent magnet and propagated by the magnetically soft shunts in embodiments to draw the flange protrusions toward the magnetically soft shunts and electro-permanent magnet. As such, a method or mechanism capable of maintaining the critical proximity between the interior surfaces of the flange protrusions and the exterior sides of the magnetically soft shunts is needed.

In previous systems, a steel plate situated atop a plastic (or other material) support plate was used to fix the scissor plates in place. The steel plate had hinge anchor points framed in it at various locations across which key assemblies would be mounted for a keyboard. This steel plate added thickness, weight, and cost to the manufacturing of the keyboard. Further, difficulty with tolerances occurred due to alignment of key assembly components including the scissor plate and associated flange with the underlying EPMs. Using such prior solutions to fix the position of the flange and/or flange protrusions with respect to the magnetically soft shunts of an EPM would result in a high potential for incorrect or imprecise placement of the flange protrusions. In a two-plate apparatus, each plate may be manufactured separately, then joined together. The dimensions of the openings through each plate, and through which the flange may be inserted, may have a first set of tolerances (e.g., error margins) that depend on the tolerances the manufacturing method is capable of achieving. When the two plates (e.g., top metal and bottom plastic plates) are combined, the margin for error in the dimensions of openings between the combined plates grows substantially. In other words, if the dimensions of an opening in the top plate are shifted to the left by a small amount, and an opening in the bottom plate are shifted to the right by another small amount, the opening made when the plates are stacked and joined may be doubled, and the misalignment magnified to result in an opening narrower than designed. In such an example, the narrower combined opening may not be wide enough to allow the flange protrusions to pass through to the extent intended. Or the hinged scissor plate with the flange intended to operate with an EPM situated below may be off by some margin. Such an incorrect placement may result in either the magnetically soft shunts impeding proper movement of the flange protrusions or the magnetic field generated by the electro-permanent magnet and propagated by the magnetically soft shunts being insufficient to pull the flange protrusions toward the EPM due to misalignment. Another solution capable of providing the needed precision in placement is needed.

Embodiments of the present disclosure address this issue by replacing the two-plate apparatus (e.g., a metal support plate lying atop a plastic support plate) with a single cap support plate. As described herein, joining two plates, each having dimensions with a margin of error, together may cause magnification of errors. However, the error margins for each individual plate may be small enough to ensure proper placement of the flange protrusions with respect to the magnetically soft shunts upon integration of all of the components. The base EPM assembly of the EPM key switch assembly may have scissor plate hinges, eyelets, anchors, or similar mechanisms mounted or framed thereon to ensure alignment of the scissor plates and flange with respect to the EPM. Embodiments of the present disclosure operably connect the scissor plates to a base EPM assembly through a single cap support plate machined with tolerances small enough to ensure proper integration of the flange protrusions with the magnetically soft shunts. The key assembly is mounted to the cap support plate.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a land-line telephone, a control system, a camera, a scanner, a facsimile machine, a printer, a pager, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

Information handling system 100 can include devices or modules that embody one or more of the devices or execute instructions for the one or more systems and modules described above, and operates to perform one or more of the methods described above. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 can include memory such as main memory 104, static memory 106, computer readable medium 122 storing instructions 124 of the electropermanent magnet keyboard control system 132, and drive unit 116 (volatile (e.g. random-access memory, etc.), nonvolatile (read-only memory, flash memory etc.) or any combination thereof). The information handling system 100 can also include one or more buses 108 operable to transmit communications between the various hardware components such as any combination of various input and output (I/O) devices.

As shown, the information handling system 100 may further include a video display 110. The video display 110 in an embodiment may function as a liquid crystal display (LCD), an organic light emitting diode (OLED), a flat panel display, a solid state display, or a cathode ray tube (CRT). Additionally, the information handling system 100 may include an input device 112, such as a cursor control device (e.g., mouse, touchpad, or gesture or touch screen input, and a keyboard 114. The information handling system 100 can also include a disk drive unit 116.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links. The wireless network may have a wireless mesh architecture in accordance with mesh networks described by the wireless data communications standards or similar standards in some embodiments but not necessarily in all embodiments.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both license and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz). It is understood that any number of available channels may be available under the 5 GHz shared communication frequency band. WLAN, for example, may also operate at a 2.4 GHz band. WWAN may operate in a number of bands, some of which are proprietary but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well. In the example embodiment, mobile information handling system 100 includes both unlicensed wireless radio frequency communication capabilities as well as licensed wireless radio frequency communication capabilities. For example, licensed wireless radio frequency communication capabilities may be available via a subscriber carrier wireless service.

In some embodiments, software, firmware, dedicated hardware implementations such as application specific integrated circuits, programmable logic arrays and other hardware devices can be constructed to implement one or more of some systems and methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions, parameters, and profiles 124 or receives and executes instructions, parameters, and profiles 124 responsive to a propagated signal, so that a device connected to a network 128 can communicate voice, video or data over the network 128. Further, the instructions 124 may be transmitted or received over the network 128 via the network interface device or wireless adapter 120.

The information handling system 100 can include a set of instructions 124 that can be executed to cause the computer system to perform any one or more of the methods or computer based functions disclosed herein. For example, instructions 124 may execute a electropermanent magnet keyboard control system 132, software agents, or other aspects or components. Various software modules comprising application instructions 124 may be coordinated by an operating system (OS), and/or via an application programming interface (API). An example operating system may include Windows®, Android®, and other OS types known in the art. Example APIs may include Win 32, Core Java API, or Android APIs.

The disk drive unit 116 and the electropermanent magnet keyboard control system 132 may include a computer-readable medium 122 in which one or more sets of instructions 124 such as software can be embedded. Similarly, main memory 104 and static memory 106 may also contain a computer-readable medium for storage of one or more sets of instructions, parameters, or profiles 124 including an estimated training duration table. The disk drive unit 116 and static memory 106 also contain space for data storage. Further, the instructions 124 may embody one or more of the methods or logic as described herein. For example, instructions relating to the electropermanent magnet keyboard control system 132 software algorithms may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the electropermanent magnet keyboard control system 132 may be executed locally or remotely. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The electropermanent magnet keyboard control system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include a electropermanent magnet keyboard control system 132 that may be operably connected to the bus 108. The electropermanent magnet keyboard control system 132 computer readable medium 122 may also contain space for data storage. The electropermanent magnet keyboard control system 132 may perform tasks related to controlling the magnetic field generated by an electropermanent magnet within a key switch assembly, or turning EPMs from an on state to an off state or vice-versa among a plurality of keys. In some embodiments, a current level in a plurality of low-coercivity magnets may correspond to a user-selected magnitude when a stepped electro-permanent magnet system is used.

In an embodiment, the electropermanent magnet keyboard control system 132 may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. Note that an information handling system can include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
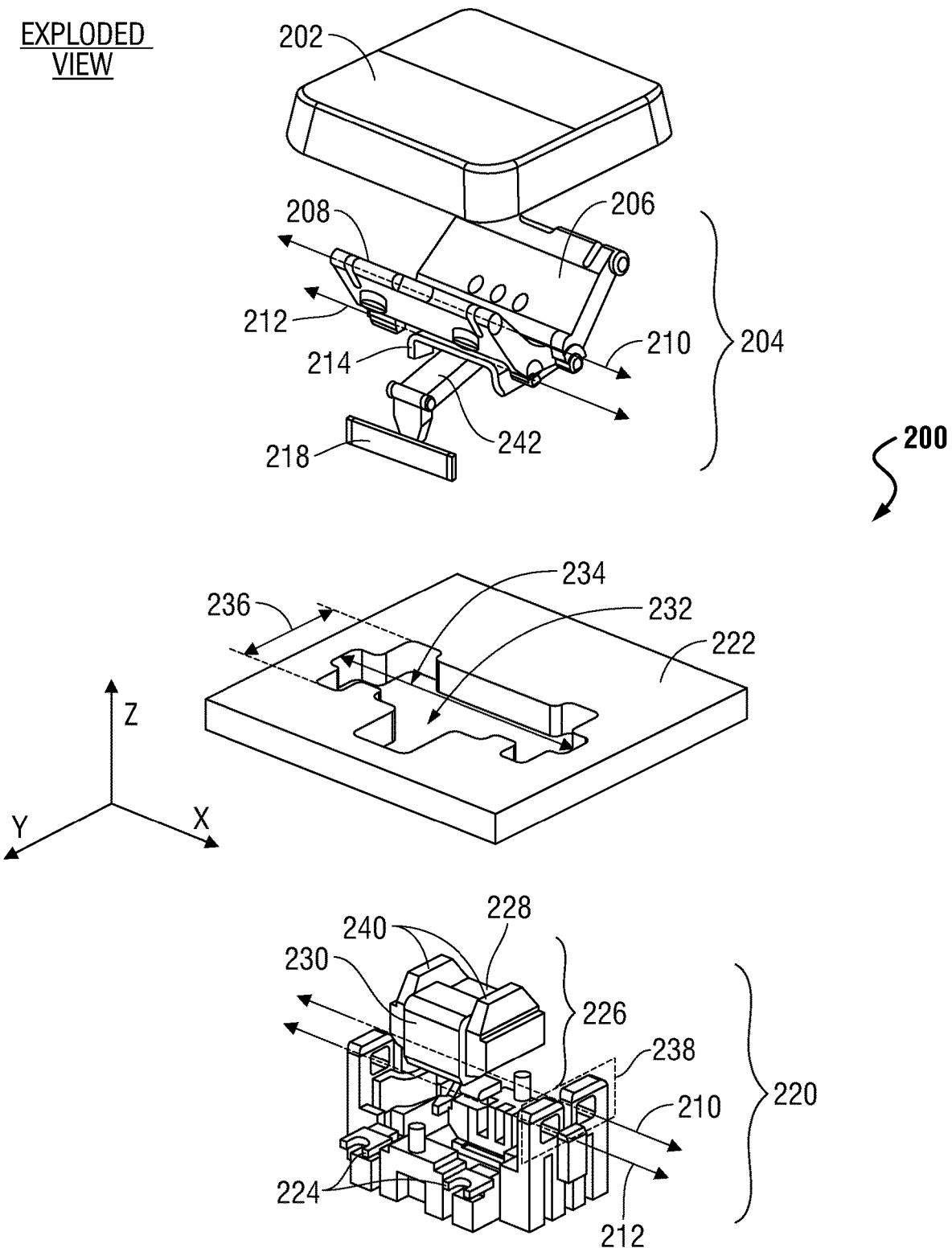
FIG. 2 is an exploded, perspective graphical diagram view of a key switch assembly with an electropermanent magnet (EPM) and a scissor plate flange according to an embodiment of the present disclosure.

FIG. 2 is an exploded, perspective graphical diagram view of a key switch assembly with an electropermanent magnet (EPM) and a scissor plate flange for magnetic attraction between the flange and the EPM according to an embodiment of the present disclosure. A key switch assembly 200 in an embodiment may enable an information handling system to register a keystroke entered by a user via a keyboard. Each key within such a keyboard may include one or more key switch assemblies 200, and may comprise a key cap 202 lying atop a scissor plate assembly 204 in an embodiment.

The scissor plate assembly 204 in an embodiment may include a rear scissor plate 206 and a front scissor plate 208, the top portions of which (e.g., portions located furthest from a rotation axis) may rotate away from one another when a sufficient downward force is exerted on the key cap 202. Such a rotation in an embodiment may cause either a portion of the scissor plates 206 and 208 themselves, or a mechanism operably attached to the scissor plates 206 and 208 to come into contact with a sensor to indicate the key has been depressed. In such a way, the rotation of the scissor plates 206 and 208 may be actuated while the information handling system registers occurrence of a keystroke.

The scissor plates 206 and 208 in an embodiment may be operably connected to a base contact assembly 220 and a cap support plate 222 immovably fixed to the keyboard of the information handling system during operations of the key assembly 200. In other words, depression of the key cap 202 in an embodiment may not cause any vertical movement of the base contact assembly 220 or of the cap support plate 222 during actuation. The cap support plate 222 in an embodiment may have a formed opening 232 disposed vertically through the cap support plate 222 such that objects may pass vertically through the opening 232. The base contact assembly 220 in an embodiment may include one or more scissor plate mounts 238 composed of vertical structures having eye holes disposed horizontally such that objects may pass horizontally through the eye holes in the scissor plate mounts 238. The scissor plate mounts 238 in such an embodiment may be disposed vertically through the support plate integration opening 232 in an embodiment. The cap support plate opening 232 in an embodiment may have a width 234 and a depth 236 sufficient to allow vertical passage of the scissor mounts 238 upward through the support plate integration opening 232. In such an embodiment, scissor plate mounts 238 integrated with or mounted to base contact assembly 220 including EPM 226 ensure alignment of 204 with 220 as mounted in a single-plate cap support plate 222. Cap support plate 222 may be a printed circuit board (PCB) with pressure or switch sensors mounted thereon (not shown) to register keystrokes. No additional steel support plate for scissor plate mounts 238 is needed.

In other embodiments, the cap support plate 222 may be machined to include the scissor mount integrated with cap support plate 222 (not shown). For example, the cap support plate 222 may be formed such that a scissor mount projects vertically upward from the cap support plate 222. In an embodiment such as with which the cap support plate 222 is formed using a three-dimensional printing method, the cap support plate 222 and scissor mount may be comprised of a single structure of consistent material makeup.

The scissor plates 206 and 208 in an embodiment may then be operably connected to the scissor mount 238 such that the rotation axis for each of the scissor plates 206 and 208 transects a cross-sectional area shared by the scissor plates 206 and 208 and the base contact assembly 220. For example, in an embodiment, a pin or similar mechanism may be disposed through the scissor plates rotation axes 210 and 212 and through the one or more holes within the scissor mount 238 to form one or more hinges. In the example embodiment illustrated by FIG. 2, the rear scissor plate 206 may be joined with the scissor mount 238 in such a way to form a hinge allowing the rear scissor plate 206 and flange 214 to rotate about the rear plate rotation axis 210 that transects a cross-sectional area (e.g., in the YZ plane) shared by both the rear scissor plate 206 and the scissor mount 238. Similarly, the front scissor plate 208 may be joined with the scissor mount 238 to allow the front scissor plate 208 to rotate about the front plate rotation axis 212 transecting a cross-sectional area (e.g., in the YZ plane) shared by both the front scissor plate 206 and the scissor mount 238. In other embodiments, the front scissor plate 208 and rear scissor plate 206 may share a single rotational axis.

As described herein, the rotation of the scissor plates 206 and 208 may occur while the information handling system registers occurrence of a keystroke following depression of the key cap 202 by a user. As a downward force is exerted on the key cap 202, the top portions of the rear scissor plate 206 and front scissor plate 208 may move away from one another in the Y-direction. Embodiments of the present disclosure may use methods to register keystrokes. For example, a keystroke in an embodiment described herein may be registered upon detected contact between one of the scissor plates 206 or 208 and a sensor. Such a sensor may be situated, in one example, on the top surface of the cap support plate 222, such that the bottom portion of one or both of the scissor plates 206 or 208 comes into contact with the sensor when the key cap 202 reaches its lowest allowable vertical position. The sensor may be, for example, a pressure sensor sensing the downward pressure from the scissor plate(s) 206 or 208, or in another example, an electrical contact that completes a circuit when it comes into contact with a corresponding metal contact located on the bottom portion of the one or more scissor plates 206 and 208.

In other embodiments, a portion of the key cap or scissor plates 206 and 208, or a structure extending from or operably attached to the key cap or scissor plates 206 and 208 may initiate contact with a sensor within the base contact assembly 220. For example, a scissor plate switch contact 218 in an embodiment may be operably connected to a spring-biased rocker arm 242 connected to the cap support plate 222 via a hinge about which the rocker arm 242 may rotate. Upon final construction of the whole key switch assembly 200 in an embodiment, the rocker arm 242 may extend outward in the Y-direction, such that the scissor plate switch contact 218 is distended slightly further forward in the Y-direction than (but at the same vertical height as) the base switch contact 224 when the key cap 202 is in its neutral position. The scissor plate switch contact 218 may also act as a biasing spring in an embodiment. While in the neutral position, the magnetic field of the EPM 226 may pull the scissor plate flange 214 downward toward the EPM 226, causing the bottom surface of the flange 214 to come into contact with the top surface of the portion of the rocker arm 242 closest to the flange 214. This contact may cause the rocker arm 242 to rotate about its hinge, such that the scissor plate switch contact 218 is pulled in the Y-direction, away from the base switch contact 224.

When the key cap 202 is forced down to its depressed position in such an embodiment, the rotation of the upper portions of scissor plates 206 and 208 away from one another (in the Y-direction) may cause the scissor plate flange 214 to rotate upward such that it no longer contacts the rocker arm 242, allowing the spring-biased rocker arm 242 to relax such that the scissor plate switch contact 218 contacts the base switch contact 224. This contact may close a circuit, which the information handling system in an embodiment may register as a key stroke.

As described herein, embodiments of the present disclosure of the key switch assembly may include an electropermanent magnet (EPM) having an on-state and an off-state, or an adjustable magnetic field housed within the base contact assembly 220. An electro-permanent magnet, such as EPM 226 may include one or more high-coercivity magnets 228 situated nearby one or more low-coercivity magnets 230. The high-coercivity magnets 228 in an embodiment may be comprised of a combination of Neodymium, Iron, and Boron. Other embodiments contemplate the use of any of these materials individually, of other materials, or of other combinations that include these materials or others generally used to create permanent magnets, including ferrous platinum, a combination of dysprosium, niobium, gallium and cobalt, and samarium-cobalt. The low-coercivity magnets 230 in an embodiment may be comprised of a combination of aluminum, nickel, and cobalt. Other embodiments contemplate the use of other materials, or other combinations that include these materials or others, including iron, and nitrogen.

An electrically conductive wire (e.g., copper wire) may be coiled around the low-coercivity magnets 230 in an embodiment. The EPM keyboard control system in an embodiment may apply a pulse of current in a first direction through the electrically conductive wires coiled around one or more of the low-coercivity magnets 230, causing the poles of the low-coercivity magnets 230 to line up with the poles of the high-coercivity magnets 228. In such an embodiment, the magnetic fields of the high-coercivity magnets 228 and low-coercivity magnets 230 may compound to generate a magnetic field having an intensity greater than that of either the high-coercivity magnetic field or the low-coercivity magnetic field alone. Such a combined magnetic field may also be propagated by one or more magnetically soft shunts 240 within the base contact assembly 220. The compound magnetic force generated by both the high-coercivity magnets 228 and the low-coercivity magnets 230 in such an embodiment may maintain this magnitude until another current pulse is applied to the electrically conductive wire. Thus, embodiments of the present disclosure capitalize on the advantage of electro-permanent magnets to maintain a magnetic field intensity with only a pulse of current. In contrast, electro-magnets require ongoing application of voltage to one or more magnetic components, thus depleting energy resources more quickly.

In another aspect of an embodiment, the EPM keyboard control system may apply a current in a second direction, opposite the first direction, causing the polarity of the magnetic field generated by the low-coercivity magnet 230 to reverse. In such an embodiment, the poles of the magnetic field generated by the high-coercivity magnets 228 may lie opposite the poles of the magnetic field generated by the low-coercivity magnets 230. The magnetic field of the high-coercivity magnet 228 may thus negate the magnetic field of the low-coercivity magnets 230, disabling the EPM 226 such that the total magnetic force of the EPM 226 is zero or of a very low magnitude. Upon application of a reverse current pulse, the polarity of the low-coercivity magnet or magnets 230 reverses and neutralizes the high-coercivity magnet 228 effectively turning off or turning down the electropermanent magnet 226.

Embodiments of the present disclosure may employ a single EPM 226, including only one high-coercivity magnet 228 and one low-coercivity magnet 230. Such a single EPM system may be capable of achieving two separate states. First, the single EPM system may achieve an on state, in which the EPM 226 generates a combined magnetic field from the high-coercivity magnet and the low-coercivity magnet. Second, the single EPM system may achieve an off state, in which the magnetic field generated by the high-coercivity magnet negates the magnetic field generated by the low-coercivity magnet. Use of an EPM with the key assembly in embodiments herein enables a decreased the thickness of the keyboard but does not negatively impact user experience because the key may feel as though it is travelling further or deeper into the keyboard due to the force required to overcome the EPM magnetic force when the EPM is activated.

In another embodiment, a multi-level-EPM may include one or more high-coercivity magnets 228 and two or more low-coercivity magnets 230. Each of the low-coercivity magnets 230 in such an embodiment may be capable of receiving a current burst independent of the other. Combinations of the polarity alignments of the low-coercivity magnets 230 relative to the one or more high-coercivity magnets 228 may yield a variety of magnetic levels. For example, the EPM keyboard control system in such an embodiment may apply a first current to a first low-coercivity magnet, causing the magnetic field of the first low-coercivity magnet to partially combine with the magnetic field of a first high-coercivity magnet. Simultaneously, the EPM keyboard control system in such an embodiment may apply a second current to a second low-coercivity magnet, causing the magnetic field of the second low-coercivity magnet to partially negate the magnetic field of the high-coercivity magnet for one magnetic level or a reverse second current may cause the second low-coercivity magnet to partially combine with the high-coercivity magnet for a third magnetic level. In such a way, the EPM keyboard control system in an embodiment may be capable of placing a multilevel-EPM 226 in one of three or more different states. Combinations of low-coercivity magnets and high-coercivity magnets may be used to provide multiple, adjustable magnetic levels in some embodiments. Further gradation in overall magnetic field strength for the EPM 226 may be achieved in other embodiments by including more than two EPMs within the key assembly 200, or by applying multiple current pulses of increasing amplitude to a single low-coercivity magnet (to increase its magnetic field strength in a step-wise fashion). The EPM keyboard control system in an embodiment may thus adjust the magnitude of the total magnetic field generated by the EPM 226 by controlling the direction of current applied to one or more electrically conductive wires coiled around one or more low-coercivity magnets 230.

The EPM 226 in an embodiment may cause the key cap 202 to return to its neutral position following depression by forcing the scissor plates toward one another. In an embodiment, such a force may be generated by magnetically attracting a structure, such as flange 214, operably connected to one or more of the scissor plates down toward the EPM 226. For example, the EPM 226 in an embodiment may generate a magnetic field that attracts a scissor plate flange 214 susceptible to magnetic forces down toward the EPM 226. The flange 214 in an embodiment may be comprised of a ferromagnetic material, such as steel, or iron. In such an embodiment, the scissor plate flange 214 may be operably connected to the rear scissor plate 206, and may extend from the base of the rear scissor plate, across the hinged portion of the rear scissor plate rotation axis 210 in the positive Y direction. When operably connected in such a configuration, any rotation of the scissor plate flange 214 about the rear plate rotation axis 210 may cause a rotation of the rear scissor plate 206 in the same direction about the rear plate rotation axis 210. For example, a rotation of the flange 214 about the rear plate rotation axis 210 that is counter-clockwise in the YZ plane may cause a counter-clockwise rotation of the top of the rear scissor plate 206 about the rear plate rotation axis 210. This counter-clockwise rotation may occur, for example, when the scissor plate flange 214, or a portion thereof is drawn downward toward the EPM 226. Thus, the attraction of the flange 214 toward the EPM 226 may cause the top portion of the rear scissor plate 206 to rotate toward the top portion of the front scissor plate 208, forcing the key cap 202 upward.

In an embodiment in which the scissor mount 238 is incorporated within the base contact assembly 220, the integration opening width 234 and depth 236 may be large enough to allow upward passage of the scissor mount 238 through the integration opening 232. In an embodiment in which the scissor mount 238 is incorporated within the cap support plate 222, the integration opening width 234 may be large enough to allow upward passage of a portion of the magnetically soft shunts 240 and downward passage of the flange 214 through the integration opening 232. In each of these embodiments, the dimensions of the integration opening width 234 may be sufficiently narrow such that downward pressure on the cap support plate 222 does not cause any portion of the cap support plate 222 to move vertically with respect to the base contact assembly 220. For example, a portion of the base contact assembly 220 located directly beneath the scissor mount 238 may provide structural support fixing the vertical position of the cap support plate 222 upon final integration of the key switch assembly 200. If the integration opening 232 were too wide or too long (in the X dimension) in such an embodiment, this structural support beneath the scissor mount 238 may pass vertically upward through the support plate integration opening 232 and fail to fix the vertical position of the cap support plate 222. Thus, the dimensions of the integration opening 232 in an embodiment may fall within narrow tolerances preset to allow partial or full passage of the flange 214, magnetically soft shunts 240, and optionally, the scissor mount 238, but to disallow passage of any other portion of the base contact assembly 220, including structural support members disposed directly beneath the scissor mount 238.

The upward force on the key cap 202 caused by the magnetic attraction between the flange 214 and the EPM 226 in an embodiment may also control the force with which a user must press down on the key cap 202 in order for the information handling system to register a keystroke. That upward force may be biased in the opposite direction by bias springs. This may assist in retracting the key cap 202 in some embodiments. Bias springs (not shown) may be mounted vertically between the scissor plate assembly 204 and the base contact assembly 220 or cap support plate 222. The bias springs may be vertically mounted with plungers to assist in biasing the flange 214 for example. The bias springs may push up against the scissor plates 206 and 208 in the center such that the scissor plates pivot away from one another about the hinge axes 210 and 212. The bias springs provide force to urge the keycap downward but light enough such that the EPM magnetic force may overcome it and still provide tactile feedback. Other spring biasing, such as with a leaf spring as described in other embodiments herein may be utilized as well. The magnetic field may be generated by the EPM 226 in an embodiment throughout the vertical movement of the key cap 202 in an embodiment. Thus, a force great enough to overcome the magnetic attraction between the flange 214 and the EPM 226 must be applied to the key cap 202 in order for the contact element within or operably connected to the scissor plate assembly 204 to come into contact with the contact element or other sensor within either the cap support plate 222 or the base contact assembly 220. As described herein, such a contact may be needed in order to register a keystroke.

Because each key assembly 200 may include an individually controllable EPM 226 in an embodiment, the EPM keyboard control system may place an EPM associated with particular keys or with the whole keyboard in an on or an off state. By disabling the EPM 226 completely, the EPM keyboard control system may ensure the key cap 202 does not return to its neutral position, thus disallowing the user to enter a keystroke with that key. This may be useful, for example, when the information handling system is a laptop placed in a closed configuration in which the keyboard is placed nearby or in close contact with the display screen. In such an embodiment, the EPM keyboard control system may detect that the laptop has been placed in the closed configuration, and disable the EPMs for all of the keys in the keyboard to draw the key caps away from the display screen such that they do not cause frictional wear and tear on the display. In another aspect, this retractability may be useful in a gaming scenario in which the key being actuated represents an action currently unavailable to the user (e.g., firing of an unavailable weapon in a first-person-shooter computer game).

Further, the EPM keyboard control system in an embodiment may turn the EPM associated with one or more keys in an on state or an off state according to external stimuli. For example, the information handling system in an embodiment may detect (e.g., via rotation sensors, hall sensors, proximity sensing elements, gyroscopes, etc.) that the information handling system has been placed in a closed or tablet configuration in which the keyboard is not likely to be used. In such an embodiment, the EPM keyboard control system may place all of the EPMs in an off state such that the keys cannot be actuated. In such a way, the user may continue to use the information handling system in tablet mode without the risk of erroneous keystrokes. Similarly, by placing the keys in a locked depressed position when the information handling system is in a closed configuration, the EPM keyboard control system in an embodiment may remove the risk of key caps damaging the digital display through unintentional contact between the two.

As another example, the EPM keyboard control system may set the force needed according to a received user input. This may allow each individual user to set the force required to press keys on the keyboard to a level that is tactilely pleasing to the user. In these ways, the EPM keyboard control system in an embodiment may cause the key switch assembly 200 to provide an upward force to return each key cap to its neutral position, cause the key switch assembly 200 to remain in a fixed depressed position that disallows the user to register a keystroke, and/or apply a user-specified (or externally triggered) resistive key force that may be adjusted on a key by key basis.

Figure 3A:
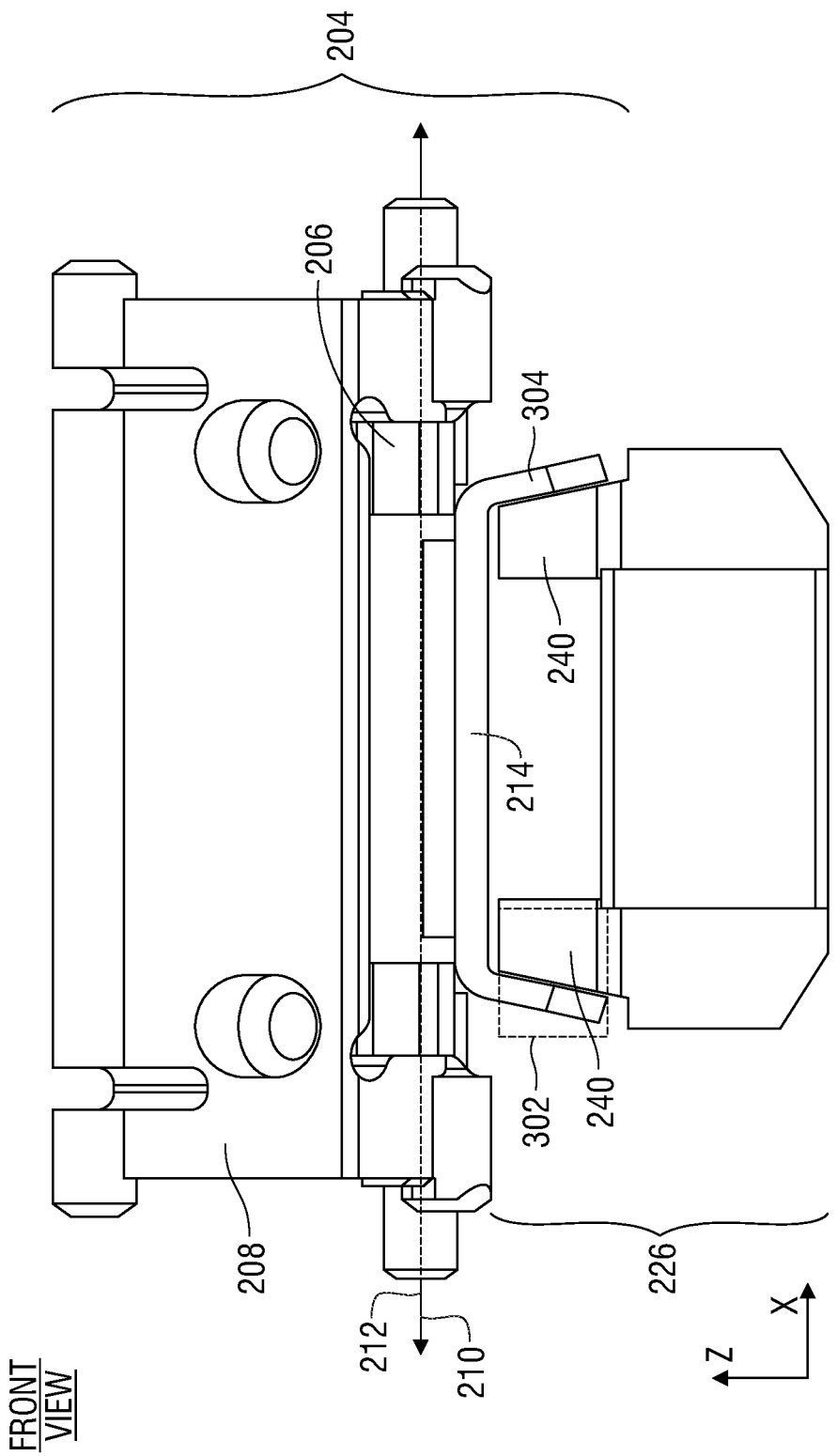
FIG. 3A is a front graphical diagram view of an electropermanent magnet (EPM) and a scissor plate assembly in a neutral position according to an embodiment of the present disclosure.

FIG. 3A is a front graphical diagram view of an electropermanent magnet (EPM) and a scissor plate assembly in a neutral position and a scissor plate flange for magnetic attraction between the flange and the EPM according to an embodiment of the present disclosure. The scissor plate flange 214 may include flange angular protrusions 304 that wrap around the outer surfaces of one or more magnetically soft shunts 240 of the EPM 226. The configuration shown in FIG. 3A reflects the orientation the scissor plate assembly 204 and the EPM 226 may have with respect to one another in an embodiment upon assembly of the full key switch assembly. The key cap and support plate portions of the key switch assembly are not shown in FIG. 3A, nor are the other portions of the scissor plate assembly 204 or the portions of the base contact assembly 220 other than the EPM 226. These structures are absent in FIGS. 3A-3B to give a non-obscured view of the proximity between the scissor plate assembly 204 and the EPM 226 in an embodiment.

As described herein, the key assembly is in a neutral state when no downward force is being exerted on the key cap. In such a state, neither the front scissor plate 208 nor the rear scissor plate 206 are be rotated away from one another about their respective axes 210 and 212 in an embodiment. The rear scissor plate 206 may be operably and fixedly attached to the scissor plate flange 214 at the rotating edge of the rear scissor plate 206 in an embodiment, such that the scissor plate flange 214 rotates when the rear scissor plate 206 rotates. In an embodiment, when the edge of the rear scissor plate 206 located opposite the rear plate rotation axis 210 moves downward with respect to the rear plate rotation axis 210, the edge of the scissor plate flange 214 located furthest from the rear plate rotation axis 210 may move upward. Similarly, when the edge of the rear scissor plate 206 located opposite the rear plate rotation axis 210 moves upward with respect to the rear plate rotation axis 210, the scissor plate flange 214 located furthest from the rear plate rotation axis 210 may move downward.

The scissor plate flange 214 may include one or more angled overlap protrusions 304, in one example embodiment, that are oriented downward when the scissor plate flange 214 is in its neutral position. Each of these angled overlap protrusions 304 in an embodiment may be in proximity to and rotate about the outer surfaces of each of the magnetically soft shunts 240 when assembled. As described herein, the force the magnetic field generated by the EPM 226 and propagated by the magnetically soft shunts 240 exerts on the flange 214 may decrease as the distance between the flange 214 and the magnetically soft shunts 240 increases. The placement of these angled overlap protrusions 304 of the scissor plate flange 214 adjacent to the exterior surfaces of the magnetically soft shunts 240 may cause a region 302 providing some of the surface area of the scissor plate flange 214 overlapping (in the Y-Z plane) a portion of a magnetically soft shunts 240 exterior surface area. In such an embodiment, the protrusions 304 of the flange 214 may operate to decrease the distance between the flange 214 and the magnetically soft shunts 240 and increase surface area within the propagated magnetic field, thus increasing the effect of the magnetic field generated by the EPM 226 and propagated by the magnetically soft shunts 240 to pull the flange 214 downward.

FIG. 3B is a front graphical diagram view of an electropermanent magnet (EPM) and a scissor plate assembly in a depressed position and a scissor plate flange shaped for increased magnetic attraction between the flange and the EPM according to an embodiment of the present disclosure. As described herein, the key assembly is in a depressed position when downward force is being exerted on the key cap (not shown), causing the front scissor plate 208 and rear scissor plate to rotate about their respective rotation axes 210 and 212 in an embodiment. In the fully depressed position, the rear scissor plate may rotate out of the front view of the scissor plate assembly. The scissor plate flange 214 in such a depressed state may also rotate when the rear scissor plate to which the flange 214 is fixedly and operably attached rotates. The EPM 226 in such an embodiment may not rotate, however, as it is in a fixed position relative to the key switch assembly.

In an embodiment, when the edge of the rear scissor plate located opposite the rear plate rotation axis 210 moves downward with respect to the rear plate rotation axis 210, as in the depressed position, the edge of the scissor plate flange 214 including angled overlap protrusions 304 located furthest from the rear plate rotation axis 210 may move upward and away from the magnetically soft shunts 240 of the fixed position EPM 226. Thus, as the key switch assembly moves into its depressed position, the distance between all surfaces of the scissor plate flange 214 may move away from the magnetically soft shunts 240 in an embodiment. As this distance increases, the overlapping region 306 in which a portion of the scissor plate EPM flange surface area is in proximity to the surface area of one or more of the magnetically soft shunts 240 may be smaller than the overlapping surface area of region 302 for the neutral position, as described with reference to FIG. 3A. In other words, as the scissor plate assembly 204 rotates into the depressed position, the effect of the force exerted by the EPM 226 magnetic field and propagated by the magnetically soft shunts 240 to pull the flange 214 toward the EPM 226 in an embodiment may decrease.

As described herein, the EPM 226 and flange 214 in an embodiment may operate to move the scissor plate assembly 204 from its fully depressed position (in which the distance between the flange 214 and the magnetically soft shunts 240 is at a maximum) to its neutral position in which the surface of the key cap is flush with nearby key caps. In order to achieve this functionality, the effect the magnetic field generated by the EPM 226 in an embodiment has on the flange 214 while the scissor plate assembly 204 is in its fully depressed position must be sufficiently strong to rotate the flange 214 toward the EPM 226. Because the effect the magnetic field generated by the EPM 226 and propagated by the magnetically soft shunts 240 in an embodiment has on the flange 214 decreases as the distance between the flange 214 and the magnetically soft shunts 240 increases, the maximum distance between the angled overlap protrusions 304 of flange 214 and the magnetically soft shunts 240 in an embodiment must fall below a preset threshold above which the magnetic field will be insufficient to rotate the flange 214 toward the EPM 226. The scissor plate flange 214 in an embodiment may be formed of a ferromagnetic material, such as steel, that may be attracted by the magnetic field generated by the EPM 226 and propagated by magnetically soft shunts 240. The EPM 226 may include low-coercivity magnets 230 and high-coercivity magnets 228 that operate in an on state or an off state, in accordance with various embodiments herein.

Figure 4:
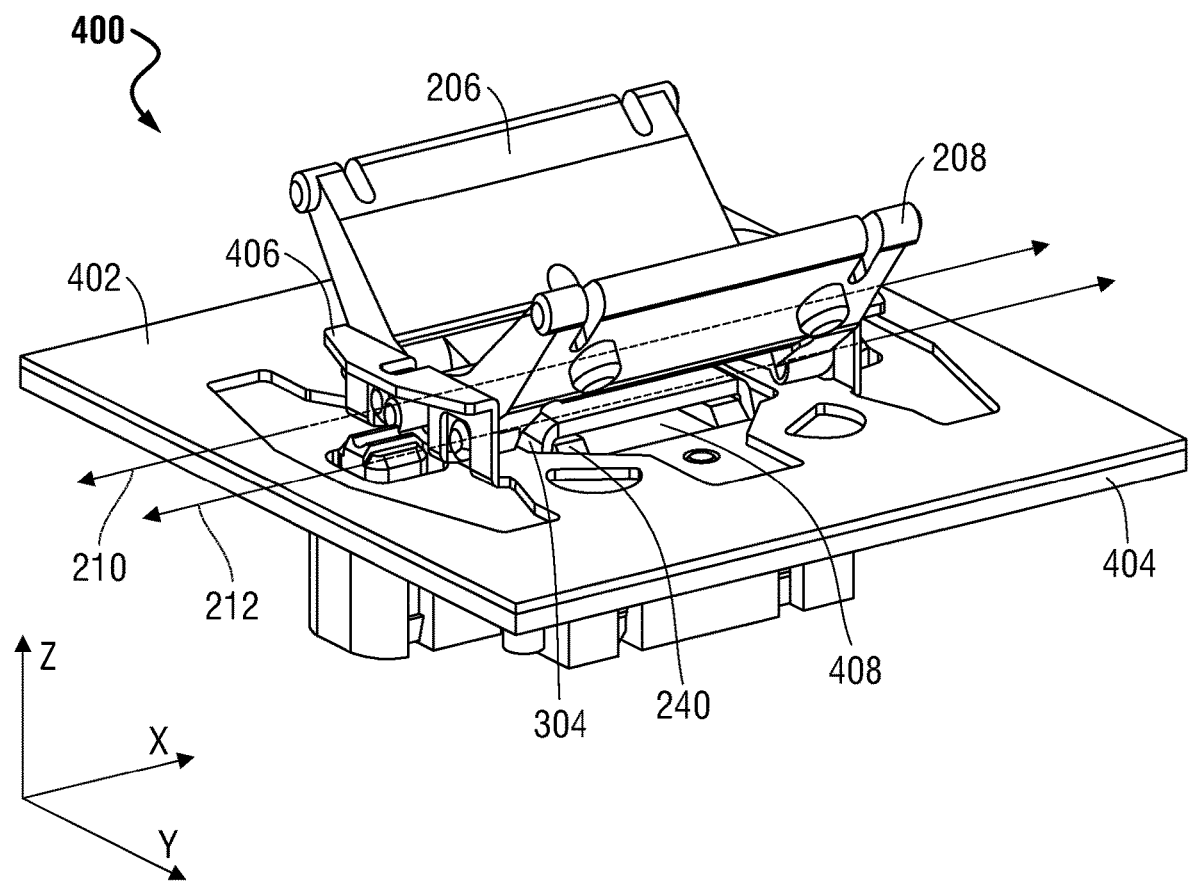
FIG. 4 is a perspective graphical diagram view of an integrated dual-plate assembly according to an embodiment of the present disclosure.

FIG. 4 is a perspective graphical diagram view of an integrated dual-plate assembly in which a scissor plate assembly is mounted to a mounting plate situated atop a cap support plate according to an embodiment of the present disclosure. As described herein, in previous dual-plate assemblies 400, a mounting plate 402 may be situated atop a thin cap support plate 404. The mounting plate 402 in such an embodiment may be formed of steel to include one or more scissor mounts 406 protruding perpendicularly from the surface of the mounting plate 402 to form a bracket. In such an embodiment, one or more scissor plates 206 and 208 may be operably coupled to the mounting plate 402 at the scissor plate mounts 406 such that the scissor plates 206 and 208 may rotate about one or more rotation axes disposed throughout a cross-sectional area shared between a portion of the mounting plate 204 and the scissor plates 206 and 208.

For example, a pin or similar structure may be disposed on the front scissor plate 208 along the front plate rotation axis 212 to operably couple to the scissor plate mounts 406 on either side and form a hinge about which the front scissor plate may rotate. Similarly, a pin or similar structure may be disposed on a portion of the rear scissor plate 206 along the rear plate rotation axis 210 to form a hinge about which the rear scissor plate may rotate. Further, each of these pins in an embodiment may pass through one or more openings in the scissor mount 406 such that the positions of the portions of the scissor plates 206 and 208 forming such hinges are formed with respect to the mounting plate 402. In such a way, the scissor plates 206 and 208 may be operably hinged to the mounting plate 402 such that the portions of the plates 206 and 208 opposite their respective rotation axes 210 and 212 may rotate about axes 210 and 212.

One or more openings may be formed throughout the thicknesses of both the mounting plate 402 and the cap support plate 404 in such an embodiment. The openings formed in the mounting plate 402 may have dimensions within a first set of tolerances, and the openings separately formed in the cap support plate 404 may have dimensions within a second set of tolerances. In other words, even if an opening formed in the mounting plate 402 is designed to identically match an opening formed in the cap support plate 404, allowable margins of error in the machining processes for both the mounting plate 402 and the cap support plate 404 may cause each of these openings to diverge slightly from their identical design. For example, an opening in the mounting plate 402 may be made slightly to the left of center, and the opening in the cap support plate 404 may be made slightly to the right of center. Upon integration of the mounting plate 402 and the cap support plate 404 together, a combined plate opening 408 may be formed. This combined plate opening 408 may have dimensions formed based on the dimensions of both the opening in the mounting plate 402 and the cap support plate 404. For example, in an embodiment in which the opening in the mounting plate 402 is made slightly to the left of center, and the opening in the cap support plate 404 is made slightly to the right of center, the total width (from right to left) of the combined plate opening 408 may be significantly less than the widths of either or both of the openings in the mounting plate 402 and the cap support plate 404. In such a way, errors made in the alignment or formation of openings within each plate in a dual-plate assembly may be compounded or magnified upon integration of the plates together within the dual-plate assembly. A ferromagnetic flange in an embodiment may be operably connected to one or more of the scissor plates 206 and 208. For example, a flange may be operably connected to the rear scissor plate 206 in an embodiment such that its angled overlap protrusions 304 are disposed at least partially through the combined plate openings 408. A portion of magnetically soft shunts 240 in an embodiment may also be disposed upward through the combined plate opening 408 such that the interior surfaces of the angled overlap protrusions 304 lie flush with the exterior surfaces of the magnetically soft shunts 240. The magnification of errors may cause the EPM key assembly to thus be misaligned or a base assembly portion with an EPM to be misaligned with the scissor plates 206 and 208 and/or the flange 214.

As described herein, the opening (e.g. combined plate opening 408) in an embodiment may be large enough to allow upward passage of the magnetically soft shunts 240 and downward passage of the angled overlap protrusions 304, but sufficiently narrow such that downward pressure on the cap support plate 222 does not cause any portion of the cap support plate 222 to move vertically with respect to the base contact assembly 220. Further, the dimensions of such an opening may need to conform to narrow tolerances to ensure a maximum distance between angled overlap protrusions 304 of a magnetic flange and one or more magnetically soft shunts 240 falls below a preset threshold above which the EPM magnetic field will be insufficient to rotate the flange into its neutral position. Because errors made in the openings within each plate in a dual-plate assembly may be compounded or magnified upon integration of the plates together, forming of a dual-plate assembly having a combined plate opening 408 with dimensions falling within these preset narrow tolerances may be very difficult, if not impossible.

Figure 5:
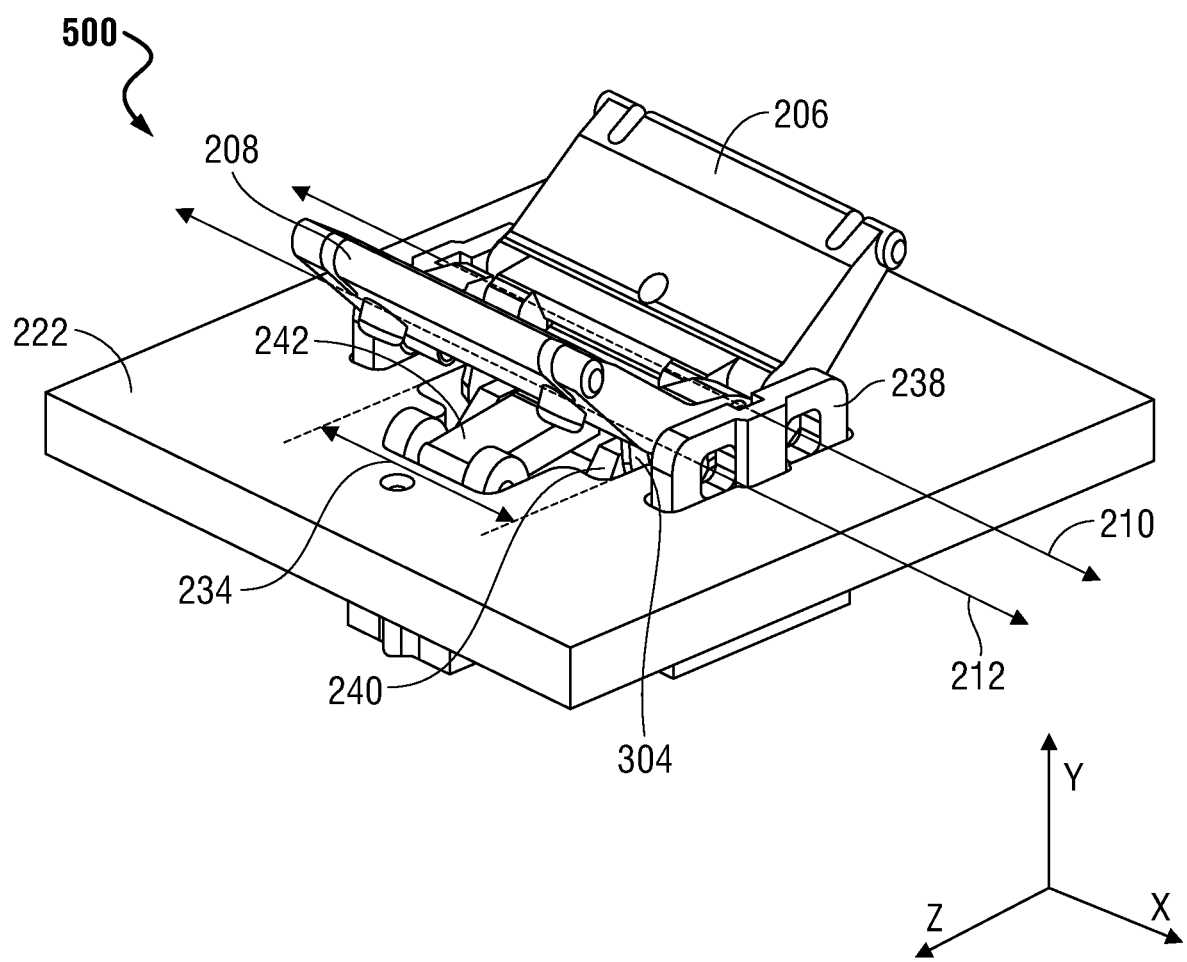
FIG. 5 is a perspective graphical diagram view of an integrated single-plate assembly according to an embodiment of the present disclosure.

FIG. 5 is a perspective graphical diagram view of an integrated single-plate assembly in which a scissor plate assembly is mounted directly to a cap support plate according to an embodiment of the present disclosure. As described herein, openings of two or more plates integrated together such that the dimensions of the openings fall within the preset narrow tolerances required in an embodiment may be difficult. The integrated single-plate assembly 500 of FIG. 5 replaces the two plates of the dual-plate assembly with a single cap support plate 222 having an opening with dimensions falling within the narrow preset tolerances described herein.

For example, the cap support plate 222 in an embodiment may replace the mounting plate and thinner cap support plate of the dual-plate assembly. An opening having dimensions falling within the preset narrow tolerances described herein may be formed through the cap support plate 222 in an embodiment. For example, the opening in the cap support plate 222 in an embodiment may have a width 234 sufficient to allow passage of angled overlap protrusions 304 downward such that their interior surfaces lie flush with the exterior surfaces of the magnetically soft shunts 240, disposed upward through the opening. Scissor plate mounts 238 may be mounted or framed directly onto the base assembly of the EPM key switch assembly to ensure alignment of the scissor plates and flange with respect to the EPM. The width 234 in an embodiment may also allow for upward passage of scissor plate mounts 238. The scissor plates 206 and 208 may be operably connected to the scissor plate mounts 238 via a hinge, and the EPM may be attached with fasteners, clamped, clipped, snapfit, soldered, glued, or otherwise affixed to the cap support plate 222. A thicker cap support plate 222 may be used in some embodiments for structural support but overall thickness or weight may be reduced in comparison to the dual-plate assembly.

The width 234 of the opening may also be small enough to ensure a maximum distance between angled overlap protrusions 304 of the magnetic flange and the magnetically soft shunts 240 falls below a preset threshold above which the EPM magnetic field would be insufficient to rotate the flange into its neutral position. If the opening through which the angled overlap protrusions 304 and magnetically soft shunts 240 is too wide, it may allow for horizontal movement (in the direction of the X axis) of the angled overlap protrusions 304 with respect to the magnetically soft shunts 240. This may allow a portion of the angled overlap protrusions 304 to move out of range of the magnetic field generated by the EPM 226 and propagated by the magnetically soft shunts 240, such that the EPM 226 magnetic field cannot rotate the flange back into its neutral position from its fully depressed position. An opening in a single cap support plate 222 that conforms to these narrow preset tolerances in an embodiment may be more easily achievable. In contrast, an opening formed by combining two separate plates (each having a separately machined opening) together may suffer from magnification of machining errors associated with each separate plate.

Figure 6:
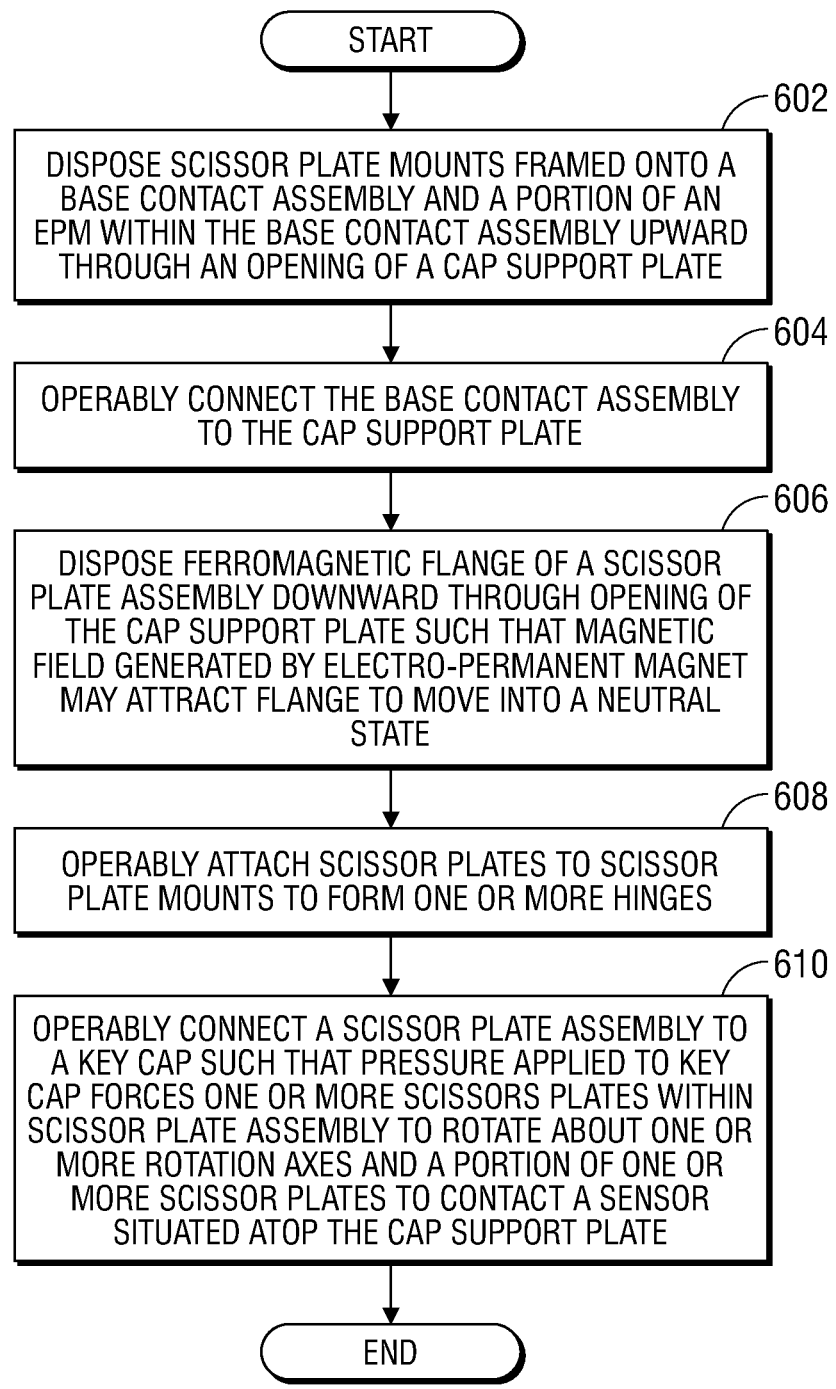
FIG. 6 is a flow diagram illustrating a method of assembly for the EPM and switch plates to form a key switch assembly according to an embodiment of the present disclosure.

FIG. 6 is a flow diagram illustrating a method of assembly for the EPM and switch plates to form a key switch assembly that may be placed in a neutral or fully depressed position according to an embodiment of the present disclosure. As described herein, use of EPMs within key switch assemblies in an embodiment may allow for an EPM keyboard control system to place the EPM of individual keys in an on state or an off state. During operation with the EPM in an on state, such key switch assemblies in an embodiment may enable an information handling system to register a keystroke entered by a user via a keyboard.

At block 602, scissor plate mounts framed onto a base contact assembly and a portion of an EPM within the base contact assembly in an embodiment may be disposed upward through an opening of a cap support plate. For example, in an embodiment described with reference to FIG. 2, the base contact assembly 220 may include one or more scissor plate mounts 238 composed of vertical structures having eye holes disposed horizontally such that objects may pass horizontally through the eye holes in the scissor plate mounts 238. The scissor plate mounts 238 in such an embodiment may be disposed vertically upward through the support plate integration opening 232. The cap support plate opening 232 may have a width 234 and a depth 236 sufficient to allow vertical passage of the scissor plate mounts 238 upward through the support plate integration opening 232. In such an embodiment, scissor plate mounts 238 may be integrated with or mounted to the base contact assembly 220 including the EPM 226 to ensure alignment of the scissor switch assembly 204 with the base contact assembly 220 upon integration of each of these assemblies with a cap support plate 222.

The base contact assembly in an embodiment may be operably connected to the cap support plate at block 604. For example, in an embodiment described with reference to FIG. 2, the base contact assembly 220, which may include the EPM 226, may be operably connected to the cap support plate 222. The base contact assembly 220 including the EPM 226 may be attached with fasteners, clamped, clipped, snapfit, soldered, glued, or otherwise affixed to the cap support plate 222.

At block 606, a ferromagnetic flange of a scissor plate assembly may be disposed downward through opening of the cap support plate in an embodiment. For example, in an embodiment described with reference to FIG. 2, the flange 214 of the scissor plate assembly 204 may be disposed (fully or partially) through the cap support plate opening 232. The cap support plate opening 232 in such an embodiment may have a width 234 and a depth 236 formed within tolerances sufficient to ensure the magnetic field generated by the EPM 226 may attract the flange 214 to move from a fully depressed position to a neutral position.

In another example embodiment described with reference to FIG. 5, the opening in the cap support plate 222 may have a width 234 sufficient to allow passage of angled overlap protrusions 304 downward such that their interior surfaces lie flush with the exterior surfaces of the magnetically soft shunts 240, disposed upward through the opening. The width 234 of the opening may also be small enough to ensure a maximum distance between angled overlap protrusions 304 of the magnetic flange and the magnetically soft shunts 240 falls below a preset threshold above which the EPM magnetic field would be insufficient to rotate the flange into its neutral position. An opening in a single cap support plate 222 that conforms to these narrow preset tolerances in an embodiment may be more easily achievable. In contrast, an opening formed by combining two separate plates (each having a separately machined opening) together may suffer from magnification of machining errors associated with each separate plate.

The scissor plates in an embodiment may be operably attached to the scissor plate mounts to form one or more hinges at block 608. For example, in an embodiment described with reference to FIG. 5, a pin or similar structure may be disposed on an edge of the front scissor plate 208 along the front plate rotation axis 212 to operably couple to the scissor plate mounts 238 on either side and form a hinge about which the front scissor plate 208 may rotate. Another pin or similar structure may also be similarly passed through one or more openings in the scissor mount 238 to operably couple the scissor plate mount 238 to the rear scissor plate 206 at the rear scissor plate rotation axis 210. In such a way, the scissor plates 206 and 208 may be operably hinged to base contact assembly housing an EPM such that the portions of the plates 206 and 208 may rotate about axes 210 and 212.

At block 610, the scissor plate assembly in an embodiment may be operably connected to a key cap such that pressure applied to the key cap forces one or more scissor plates within the scissor plate assembly to rotate about one or more rotation axes. For example, in an embodiment described with reference to FIG. 2, each key in a keyboard may be incorporated within a key switch assembly 200, and may comprise a key cap 202 lying atop a scissor plate assembly 204. The scissor plate assembly 204 in an embodiment may include a rear scissor plate 206 and a front scissor plate 208. As a downward force is exerted on the key cap 202, the top portions (e.g. portions located furthest from the rotation axes 210 and 212) of the rear scissor plate 206 and front scissor plate 208 may move away from one another in the Y-direction and downward in the Z direction. In one embodiment, the rear scissor plate 206 may rotate around a rear scissor plate rotation axis 210, and the front scissor plate 208 may rotate around a front scissor plate rotation axis 212. In other embodiments, both scissor plates 206 and 208 may operate about a single rotation axis. In still other embodiments, only one scissor plate may be employed, and it may rotate about a single rotation axis.

In an embodiment, a keystroke in an embodiment described herein may be registered upon detected contact between one of the scissor plates 206 or 208 and a sensor. Such a sensor may be situated, in one example, on the top surface of the cap support plate 222, such that the bottom portion of one or both of the scissor plates 206 or 208 comes into contact with the sensor when the key cap 202 reaches its lowest allowable vertical position. The sensor may be, for example, a pressure sensor sensing the downward pressure from the scissor plate(s) 206 or 208, or in another example, an electrical contact that completes a circuit when it comes into contact with a corresponding metal contact located on the bottom portion of the one or more scissor plates 206 and 208. For example, the sensor may be a pressure sensor located on the top surface of the cap support plate, directly beneath one or more of the scissor plates 206 and 208. In such a way, a key switch assembly 200 in an embodiment may enable an information handling system to register a keystroke entered by a user via a keyboard.

The blocks of the flow diagrams of FIG. 6 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An electro-permanent magnet (EPM) key assembly of an information handling system comprising:
   a cap support plate comprising a printed circuit board with pressure sensors to record keystrokes for mounting the EPM key assembly;
   a pair of scissor plates operably connected to a base contact assembly including an EPM such that each of the pair of scissor plates may rotate away from one another in the presence of downward force on a key cap;
   the key cap situated atop the pair of scissor plates for actuation of the EPM key assembly;
   the EPM having including a low-coercivity magnet and a high coercivity magnet to be switched between an on state via current passed through a conductor coiled about the low-coercivity magnet to assert a magnetic field on a ferromagnetic flange operatively coupled to rotate with at least one scissor plate about a hinge and an off state to release the ferromagnetic flange from the magnetic field and retract the key cap; and
   a cap support plate opening through which a scissor plate hinge mount of the base contact assembly is disposed from under a first side of the cap support plate, and wherein the base contact assembly is operatively coupled to the pair of scissor plates on the scissor plate hinge mounts above the second side of the cap support plate.

2. The electro-permanent magnet key assembly of claim 1, wherein a top surface of the key cap lies flush with one or more remaining keys of a keyboard including the EPM key assembly in the absence of downward force on the key cap when the EPM is in the on state.

3. The electro-permanent magnet key assembly of claim 1, wherein the pressure sensors cannot record keystrokes when the key cap is retracted.

4. The electro-permanent magnet key assembly of claim 1, wherein the pressure sensors record a keystroke upon a detected contact between the pressure sensors and a bottom surface of one or both of the pair of scissor plates.

5. The electro-permanent magnet key assembly of claim 1, wherein the EPM comprises the low-coercivity magnet and the high coercivity magnet, and a direction of current applied to an electrically conductive wire coiled around the low-coercivity magnet places the EPM in the on state or the off state.

6. The electro-permanent magnet key assembly of claim 1, wherein the high-coercivity magnet is comprised of Neodymium Iron Boron.

7. The electro-permanent magnet key assembly of claim 1, wherein the low-coercivity magnet is comprised of aluminum, nickel and cobalt.

8. A method for assembling an electro-permanent magnet (EPM) key assembly of an information handling system comprising:
   disposing a pair of scissor plate mounts framed onto a base contact assembly and a portion of an EPM within the base contact assembly upward through a cap support plate opening within a cap support plate;
   the cap support plate comprising a printed circuit board for mounting the EPM key assembly and the printed circuit board having a pressure sensor to record keystrokes;
   operably connecting the base contact assembly with the EPM to the cap support plate;
   disposing a ferromagnetic flange operably coupled to rotate with at least one scissor plate about a scissor plate hinge mounts protruding through the cap support plate opening;
   coupling a current source to a conductor coiled about a low-coercivity magnet of the EPM to switch the EPM from an on state to an off state via direction of current applied to around the low-coercivity magnet of the EPM;
   operably connecting the pair of scissor plates to the base contact assembly via the scissor plate hinge mounts such that each of the pair of scissor plates may rotate away from one another in the presence of downward force on a key cap to engage the pressure sensor; and
   situating the key cap atop the pair of scissor plates.

9. The method of claim 8 further comprising:
   placing the EPM in the on state to assert a magnetic field on the ferromagnetic flange sufficient to rotate the ferromagnetic flange about the hinge in the absence of downward force on the key cap, causing a top surface of the key cap to lie flush with one or more remaining keys of a keyboard including the EPM key assembly.

10. The method of claim 9 further comprising:
applying an electrical current to an electrically conductive wire coiled around a low-coercivity magnet of the EPM such that a magnetic field generated by the low-coercivity magnet has poles aligned with a magnetic field generated by a high-coercivity magnet of the EPM.

11. The method of claim 8 further comprising:
placing the EPM in an off state to retract the key cap toward the base contact assembly upon release of the magnetic field on the ferromagnetic flange such that the pressure sensor cannot record keystrokes.

12. The method of claim 11 further comprising:
applying an electrical current to an electrically conductive wire coiled around a low-coercivity magnet of the EPM such that a magnetic field generated by the low-coercivity magnet has poles opposite a magnetic field generated by a high-coercivity magnet of the EPM.

13. The method of claim 8 further comprising:
soldering the base contact assembly to the cap support plate.

14. The method of claim 8 further comprising:
operably connecting the base contact assembly to the cap support plate via fasteners.

15. An electro-permanent magnet (EPM) key assembly of an information handling system comprising:
a cap support plate comprising a printed circuit board with a pressure sensor to record keystrokes for mounting the EPM key assembly;
a pair of scissor plates operably connected to a base contact assembly including an EPM such that each of the pair of scissor plates may rotate away from one another in the presence of downward force on a key cap;
the key cap situated atop the pair of scissor plates for actuation of the EPM key assembly;
the EPM comprising a low-coercivity magnet and a high coercivity magnet switchable via application of a first direction of current applied to an electrically conductive wire coiled around the low-coercivity magnet to place the EPM in an on state to assert a magnetic field on a ferromagnetic flange operatively coupled to rotate with at least one scissor plate about a hinge or a second direction of current applied to the electrically conductive wire to place the EPM in an off state to release the ferromagnetic flange from the magnetic field and retract the key cap; and
a cap support plate opening through which a scissor plate hinge mount of the base assembly is disposed from under a first side of the cap support plate and the base contact assembly is operatively coupled to the pair of scissor plates mounted on scissor plate hinge mount above the second side of the cap support plate.

16. The electro-permanent magnet key assembly of claim 15, wherein a top surface of the key cap lies flush with one or more remaining keys of a keyboard including the EPM key assembly in the absence of downward force on the key cap when the EPM is in the on state.

17. The electro-permanent magnet key assembly of claim 15, wherein the pressure sensor cannot record keystrokes when the key cap is retracted.

18. The electro-permanent magnet key assembly of claim 15, wherein the pressure sensors record a keystroke upon a detected contact between the pressure sensors and a bottom surface of one or both of the pair of scissor plates.

19. The electro-permanent magnet key assembly of claim 15, wherein the high-coercivity magnet is comprised of Neodymium Iron Boron.

20. The electro-permanent magnet key assembly of claim 15, wherein the low-coercivity magnet is comprised of aluminum, nickel and cobalt.

* * * * *